(12) United States Patent
Wu et al.

(10) Patent No.: US 7,948,818 B1
(45) Date of Patent: *May 24, 2011

(54) MEMORY REPAIR SYSTEM AND METHOD

(75) Inventors: Albert Wu, Palo Alto, CA (US); Sehat Sutardja, Los Altos, CA (US)

(73) Assignee: Marvell International Ltd., Hamilton (BM)

( * ) Notice: Subject to any disclaimer, the term of this patent is extended or adjusted under 35 U.S.C. 154(b) by 0 days.

This patent is subject to a terminal disclaimer.

(21) Appl. No.: 12/827,446

(22) Filed: Jun. 30, 2010

Related U.S. Application Data

(63) Continuation of application No. 12/082,760, filed on Apr. 14, 2008, now Pat. No. 7,751,264, which is a continuation of application No. 11/349,460, filed on Feb. 7, 2006, now Pat. No. 7,359,261.

(60) Provisional application No. 60/683,975, filed on May 23, 2005.

(51) Int. Cl.
*G11C 7/00* (2006.01)
(52) U.S. Cl. ............... 365/200; 365/201; 365/230.06
(58) Field of Classification Search .............. 365/200, 365/201, 225.7, 230.06
See application file for complete search history.

(56) References Cited

U.S. PATENT DOCUMENTS

| | | | |
|---|---|---|---|
| 4,250,570 A | 2/1981 | Tsang et al. | |
| 6,178,126 B1 | 1/2001 | Kirihata et al. | |
| 6,449,197 B1 | 9/2002 | Hiraki et al. | |
| 6,667,917 B1 | 12/2003 | Templeton et al. | |
| 6,728,148 B2 | 4/2004 | Yamauchi | |
| 6,940,765 B2 | 9/2005 | Kyung | |
| 7,187,602 B2 * | 3/2007 | Wohlfahrt et al. | 365/200 |
| 7,359,261 B1 | 4/2008 | Wu et al. | |
| 7,751,264 B1 * | 7/2010 | Wu et al. | 365/200 |

OTHER PUBLICATIONS

Self-Repair Boosts Memory SoC Yields; Vincent Ratford; CommsDesign.com; Sep. 5, 2001; 6 pages.

* cited by examiner

*Primary Examiner* — David Lam

(57) ABSTRACT

An integrated circuit (IC) comprises a memory module that stores at least one of data and code. A memory repair database stores data relating to defective memory addresses. A memory control module detects defective memory locations in the memory module, locates redundant memory elements in the memory module, and stores information that associates memory addresses of the defective memory locations with the redundant memory elements in the memory repair database. Storing said information includes electrically altering at least one of a plurality of electrical fuses. A redundant memory decoder module receives the information and physically remaps the memory addresses to the redundant memory locations.

15 Claims, 16 Drawing Sheets

MEMORY REPAIR SYSTEM AND METHOD

CROSS-REFERENCE TO RELATED APPLICATIONS

This application is a continuation of U.S. patent application Ser. No. 12/082,760, filed Apr. 14, 2008, now U.S. Pat. No. 7,751,264, which is a continuation of U.S. patent application Ser. No. 11/349,460, filed Feb. 7, 2006, now U.S. Pat. No. 7,359,261, which application claims the benefit of U.S. Provisional Application No. 60/683,975, filed May 23, 2005. The disclosures of the above applications are incorporated herein by reference in their entirety.

FIELD OF THE INVENTION

The present invention relates to memory devices, and more particularly to repairing memory locations of memory devices.

BACKGROUND OF THE INVENTION

Semiconductor memory devices, such as DRAM, SRAM, EPROM, and/or FLASH, include an integrated circuit that stores data and/or code. In certain applications, loss of any of the data and/or code may require a manufacturer and/or end user to replace the memory, which is costly. As such, reliability of the memory is important.

Semiconductor memory typically includes defects that occur during the manufacturing process. Typically, one or more memory locations (i.e. bit addresses) may be defective. Data may not be correctly written and/or read from these locations, which adversely affects the operation of the system that includes the memory.

Referring now to FIG. 1, an exemplary computing device 10 includes a system on chip (SOC) 12 and a memory module 14 that are mounted on a printed circuit board 15 or within a multi-chip-module (MCM) package. For example, the computing device 10 may be a component of a mobile computing device, a cellular phone, a laptop computer, and/or any other computing device, or the computing device 10 may be a device applying MCM package technology that can be used as a component in a system. The SOC 12 includes a processor 18, an input/output (I/O) interface 20, and other SOC components 22 for interfacing with the processor 18 or otherwise communicating with the computing device 10. The processor 18 interfaces with the memory module 14 and the other components 22 of the computing device 10. The computing device 10 may also include other I/O devices 24 that interface with the memory module 14 and the components of the SOC 12.

Referring now to FIG. 2, an alternative arrangement of an SOC 32 and a memory module 34 is shown. The memory module 34 is integrated with the SOC 32 (in other words, the memory module 34 is embedded).

Referring now to FIG. 3, data is stored in the memory module 40 according to memory addresses. The memory addresses define specific storage locations of data bits in memory 40. For example, the memory module 40 includes memory banks 42-1, 42-2, . . . , and 42-x (referred to collectively as memory banks 42). Each memory bank 42 includes address rows 44-1, 44-2, . . . , and 44-y, referred to collectively as address rows 44, and address columns 46-1, 46-2, . . . , and 46-z (referred to collectively as address columns 46). Data bits that are stored in the memory module 40 are stored according to specific address rows 44 and address columns 46 in each memory bank 42.

Various methods are used to correct defects and improve memory yield. Referring now to FIGS. 4A and 4B, a memory module 50 may include redundant memory elements. When certain bit locations are defective, the redundant memory elements are used to replace the defective bit locations. The memory module 50 includes memory banks 52, address rows 54, and address columns 56 as described above in conjunction with FIG. 3. Additionally, each memory bank 52 includes redundant address rows 58-1, 58-2, . . . , and 58-m (referred to collectively as redundant address rows 58), and/or redundant address columns 60-1, 60-2, . . . , and 60-n (referred to collectively as redundant address columns 60).

Initially, the bit locations provided by the redundant address rows 58 and address columns 60 are not associated with a particular memory address. A redundant memory circuit 62 communicates with the memory module 50. The redundant memory circuit 62 programs the redundant address rows 58 and address columns 60 to correspond to a specific memory address when a bit location associated with the memory address is found to be defective. For example, the redundant memory circuit 62 may include fuses 63-1, 63-2, . . . , and 63-a, referred to collectively as fuses 63 (e.g. laser fuses and/or electrical fuses). An external memory repair device 64 is connected to the redundant memory circuit 62 to determine a defective bit location associated with a memory address. The memory repair device 64 blows the one or more of the fuses 63 (i.e. applies a laser or electrical current to the fuses 63) to form a new data path to the redundant location. Thereafter, data that is directed to be stored at the memory address will be stored in the redundant location. In this manner, an originally defective memory device is repaired and is suitable to be used and/or sold.

Referring now to FIG. 4B, an exemplary redundant memory circuit 62 is shown in further detail. Signals 65-1, 65-2, . . . , and 65-b, referred to collectively as signals 65, are indicative of memory addresses of defective memory locations. For example, the signals 65 may be indicative of a defective address row. The redundant memory circuit 62 receives the signals 65 and a repair signal 66 from the memory repair device 64. The signals 65 are input to a redundant row decoder 67. The redundant row decoder 67 communicates with a redundant row 68 according to statuses of the fuses 63. As described above, the memory repair device 64 may be used to blow one or more of the fuses 63 to program the redundant row decoder 67 to associate a particular memory address with the redundant row 68. A similar approach may be used for redundant columns.

The above-described memory repair operation results in a permanent re-association of the memory address with the redundant location. The memory repair operation permanently changes the electrical behavior of the fuse element. In the case of a laser fuse, a high energy laser beam cuts through the fuse (i.e. a conductive fuse element is rendered non-conductive as a result of the memory repair operation). In the case of an electrical fuse, an electric pulse or pulses are applied to the fuse element. As a result, the fuse element changes from conductive to non-conductive or from non-conductive to conductive.

Referring now to FIG. 5, a memory module 70 includes memory banks 72. Each memory bank 72 includes memory blocks 74-1, 74-2, . . . , and 74-p, referred to collectively as memory blocks 74. Each memory block 74 includes address rows and columns as described above. A redundant memory block 76 functions as a redundant memory element. The redundant memory block 76 includes redundant address rows and columns as described above.

Referring now to FIG. 6, a memory module 80 includes memory banks 82-1, 82-2, ..., and 82-q (referred to collectively as memory banks 82). Additionally, the memory module 80 includes a redundant memory bank 84. The redundant memory bank 84 includes redundant address rows and columns as described above.

Typically, semiconductor memory devices are tested after the manufacturing process and prior to being sold. For example, the semiconductor devices are tested according to a wafer sort and/or final test. The wafer sort and final test procedures determine functionality of all bits of the memory device. Subsequently, defective bits are detected and recorded. The defective bits are compared to the storage capabilities of the redundant memory elements. If there are enough redundant memory elements to compensate for the defective bits, a memory repair operation is performed as described above to re-associate the memory addresses of the defective bit locations with the redundant memory elements.

In certain situations, memory elements are not initially defective and instead materialize as latent defects. Latent defects become known after the memory device is used in the field. To detect potential latent defects during manufacturing, a "burn-in" procedure is applied. For example, a voltage is applied to the memory devices while operating at a high environmental temperature (e.g., 125° C.). Subsequent tests are then able to detect the latent defects. If there unused redundant memory elements remaining, additional memory repair operations may be performed.

The above-described burn-in procedure requires the use of ovens and burn-in boards, which can be costly. When the memory device is embedded in a SOC product, the burn-in boards are not reusable, which further increases expense. The burn-in procedure may require anywhere from 8 to 72 hours to reveal the latent defects. As such, the burn-in procedure increases manufacturing time and cost.

Burn-in does not always detect all latent defects. Therefore, defective memory locations might not be revealed until later in the system manufacturing process, during a packaging process, and until after sale. When a defective memory device is found during the system manufacturing process, the defective memory device may be replaced. The later in the procedure that defective memory elements are detected and replaced, the greater the cost to the manufacturer.

SUMMARY OF THE INVENTION

An integrated circuit (IC) comprises a memory module that stores at least one of data and code. A memory repair database stores data relating to defective memory addresses. A memory control module communicates with the memory module and the memory repair database, detects defective memory locations in the memory module, locates redundant memory elements in the memory module, stores information that associates memory addresses of the defective memory locations with the redundant memory elements in the memory repair database, and outputs the information. A redundant memory decoder module receives the information and physically remaps the memory addresses to the redundant memory locations.

In other features, at least one of the memory module, the memory repair database, the redundant memory decoder module, and the memory control module is integrated with a system on chip (SOC). The memory module includes the redundant memory decoder module. The redundant memory decoder module includes at least one of a row decoder, a column decoder, a bank decoder, and an input/output (I/O) decoder that forms associations between the memory addresses and the redundant memory elements according to the information. The memory repair database stores the defective memory locations in volatile memory and the memory control module updates the memory repair database when the IC powers on. The memory repair database stores defective memory locations in non-volatile memory.

In still other features, a multi-chip-module (MCM) comprises the memory control module and a system on chip (SOC) that comprises the memory repair database and the memory control module. The SOC further comprises the memory module. An MCM comprises the redundant memory decoder module and a system on chip (SOC) that comprises the memory repair database, the redundant memory decoder module, and the memory control module. The SOC further comprises the memory module.

In other features, an IC comprises a memory module that includes redundant memory elements and that stores at least one of data and code. Electrical fuses determine memory addresses of the redundant memory elements. A memory repair circuit communicates with the electrical fuses. A memory control module communicates with the memory module and the memory repair circuit, detects defective memory locations in the memory module, locates redundant memory elements in the memory module, and directs the memory repair circuit to adjust at least one of the electrical fuses to assign memory addresses to the redundant memory elements.

In still other features, the memory module, the memory repair circuit, and the memory control module are integrated with a system on chip (SOC). The memory repair circuit includes at least one of a row decoder, a column decoder, a bank decoder, and an input/output (I/O) decoder. The memory repair circuit comprises the electrical fuses.

In other features, an IC comprises a memory module that stores at least one of data and code. A memory control module communicates with the memory module, detects defective memory locations in the memory module, locates redundant memory elements in the memory module, includes electrical fuses that determine memory addresses of the redundant memory elements, and adjusts at least one of the electrical fuses to associate the memory addresses with the redundant memory elements.

In still other features, at least one of the memory module and the memory control module is integrated with a system on chip (SOC). A redundant memory decoder module communicates with the memory module and the memory control module, receives information from the memory control module that associates the memory addresses with the redundant memory elements according to the electrical fuses, and corrects the defective memory locations according to the information. The redundant memory decoder module includes at least one of a row decoder, a column decoder, a bank decoder, and an input/output (I/O) decoder that forms associations between the memory addresses and the redundant memory elements according to the information.

In still other features, an MCM comprises the memory control module and a system on chip (SOC) that comprises the memory module and the memory control module. An MCM comprises the redundant memory decoder module and a system on chip (SOC) that comprises the memory module, the redundant memory decoder module, and the memory control module.

In other features, a memory repair method comprises storing at least one of data and code in a memory module, storing data relating to defective memory addresses of the memory module in a memory repair database, detecting defective memory locations in the memory module, locating redundant memory elements in the memory module, storing information that associates memory addresses of the defective memory locations with the redundant memory elements in the memory repair database; and physically remapping the memory addresses to the redundant memory locations.

In still other features, at least one of the memory module and the memory repair database is integrated with a system on chip (SOC). The memory repair method further comprises receiving the information associating the defective memory locations at a redundant memory decoder module and correcting the defective memory locations according to the information. The redundant memory decoder module includes at least one of a row decoder, a column decoder, a bank decoder, and an input/output (I/O) decoder that forms associations between the memory addresses and the redundant memory elements according to the information. The defective memory locations are stored in volatile memory. The method and further comprises powering on a system that comprises the memory module and updating the memory repair database when the system powers on. Defective memory locations are stored in non-volatile memory. An MCM system implements the memory repair method.

In other features, a memory repair method comprises providing a memory module that includes redundant memory elements, a memory repair module, and a memory control module on an SOC, storing at least one of data and code in the memory module, determining memory addresses of the redundant memory elements according to electrical fuses, communicating with the electrical fuses with the memory repair circuit, detecting defective memory locations in the memory module with the memory control module, locating redundant memory elements in the memory module with the memory control module, and directing the memory repair circuit to adjust at least one of the electrical fuses to assign memory addresses to the redundant memory elements with the memory control module.

In still other features, the memory repair circuit includes at least one of a row decoder, a column decoder, a bank decoder, and an input/output (I/O) decoder. The memory repair circuit comprises the electrical fuses.

In other features, a memory repair method comprises storing at least one of data and code in a memory module, communicating with the memory module with a memory control module, detecting defective memory locations in the memory module with the memory control module, locating redundant memory elements in the memory module with the memory control module, determining memory addresses of the redundant memory elements with electrical fuses that are located in the memory control module, and adjusting at least one of the electrical fuses to associate the memory addresses with the redundant memory elements.

In still other features, the memory repair method further comprises communicating with the memory module and the memory control module with a redundant memory decoder module, receiving information from the memory control module that associates the memory addresses with the redundant memory elements according to the electrical fuses at the redundant memory decoder module, and correcting the defective memory locations according to the information. The redundant memory decoder module includes at least one of a row decoder, a column decoder, a bank decoder, and an input/output (I/O) decoder that forms associations between the memory addresses and the redundant memory elements according to the information.

In still other features, an MCM implements the memory repair method. The memory repair method further comprises integrating the redundant memory decoder module, the memory module, and the memory control module on an SOC.

In other features, an IC comprises memory means for storing at least one of data and code, memory repair database means for storing data relating to defective memory addresses, memory control means for communicating with the memory means and the memory repair database means, for detecting defective memory locations in the memory means, for locating redundant memory elements in the memory means, for storing information that associates memory addresses of the defective memory locations with the redundant memory elements in the memory repair database means, and for outputting the information, and redundant memory decoding means for receiving the information and physically remapping the memory addresses to the redundant memory locations.

In still other features, at least one of the memory means, the memory repair database means, the redundant memory decoding means, and the memory control means is integrated with a system on chip (SOC). The memory means includes the redundant memory decoding means. The redundant memory decoding means includes at least one of a row decoder, a column decoder, a bank decoder, and an input/output (I/O) decoder that forms associations between the memory addresses and the redundant memory elements according to the information. The memory repair database means stores the defective memory locations in volatile memory and the memory control means updates the memory repair database means when the IC powers on. The memory repair database means stores defective memory locations in non-volatile memory.

In still other features, a multi-chip-module (MCM) comprises the memory control module and a system on chip (SOC) that comprises the memory repair database means and the memory control means. The SOC further comprises the memory means. An MCM comprises the redundant memory decoding means and a system on chip (SOC) that comprises the memory repair database means, the redundant memory decoding means, and the memory control means. The SOC further comprises the memory means.

In other features, an IC comprises memory means for storing at least one of data and code and that includes redundant memory elements, electrical fuse means for determining memory addresses of the redundant memory elements, memory repair means for communicating with the electrical fuse means, and memory control means for communicating with the memory means and the memory repair means, for detecting defective memory locations in the memory means, for locating redundant memory elements in the memory means, and for directing the memory repair means to adjust the electrical fuse means to assign memory addresses to the redundant memory elements.

In still other features, the memory means, the memory repair means, and the memory control means are integrated with a system on chip (SOC). The memory repair means includes at least one of a row decoder, a column decoder, a bank decoder, and an input/output (I/O) decoder. The memory repair means comprises the electrical fuse means.

In other features, an IC comprises memory means for storing at least one of data and code and memory control means for communicating with the memory means, for detecting defective memory locations in the memory means, for locating redundant memory elements in the memory means, for including electrical fuse means for determining memory addresses of the redundant memory elements, and for adjusting the electrical fuse means to associate the memory addresses with the redundant memory elements.

In still other features, at least one of the memory module and the memory control module is integrated with a system on chip (SOC). The IC further comprises redundant memory decoding means for communicating with the memory means and the memory control means, for receiving information from the memory control means that associates the memory addresses with the redundant memory elements according to the electrical fuse means, and for correcting the defective memory locations according to the information. The redundant memory decoding means includes at least one of a row decoder, a column decoder, a bank decoder, and an input/output (I/O) decoder that forms associations between the memory addresses and the redundant memory elements according to the information.

In still other features, an MCM comprises the memory control means and a system on chip (SOC) that comprises the memory means and the memory control means. An MCM comprises the redundant memory decoding means and a system on chip (SOC) that comprises the memory means, the redundant memory decoding means, and the memory control means.

In other features, a computer program executed by a processor comprises storing at least one of data and code in a memory module, storing data relating to defective memory addresses of the memory module in a memory repair database, detecting defective memory locations in the memory module, locating redundant memory elements in the memory module, and storing information that associates memory addresses of the defective memory locations with the redundant memory elements in the memory repair database.

In still other features, at least one of the memory module and the memory repair database is integrated with a system on chip (SOC). The computer program further comprises receiving the information associating the defective memory locations at a redundant memory decoder module and correcting the defective memory locations according to the information. The redundant memory decoder module includes at least one of a row decoder, a column decoder, a bank decoder, and an input/output (I/O) decoder that forms associations between the memory addresses and the redundant memory elements according to the information.

In still other features, the defective memory locations are stored in volatile memory and the computer program further comprises powering on a system that comprises the memory module and updating the memory repair database when the system powers on. Defective memory locations are stored in non-volatile memory.

In other features, a computer program executed by a processor comprises providing a memory module that includes redundant memory elements, a memory repair module, and a memory control module on an SOC, storing at least one of data and code in the memory module, determining memory addresses of the redundant memory elements according to electrical fuses, communicating with the electrical fuses with the memory repair circuit, detecting defective memory locations in the memory module with the memory control module, locating redundant memory elements in the memory module with the memory control module, and directing the memory repair circuit to adjust at least one of the electrical fuses to assign memory addresses to the redundant memory elements with the memory control module.

In still other features, the memory repair circuit includes at least one of a row decoder, a column decoder, a bank decoder, and an input/output (I/O) decoder. The memory repair circuit comprises the electrical fuses.

In other features, a computer program executed by a processor comprises storing at least one of data and code in a memory module, communicating with the memory module with a memory control module, detecting defective memory locations in the memory module with the memory control module, locating redundant memory elements in the memory module with the memory control module, determining memory addresses of the redundant memory elements with electrical fuses that are located in the memory control module, and adjusting at least one of the electrical fuses to associate the memory addresses with the redundant memory elements.

In still other features, the computer program further comprises communicating with the memory module and the memory control module with a redundant memory decoder module, receiving information from the memory control module that associates the memory addresses with the redundant memory elements according to the electrical fuses at the redundant memory decoder module, and correcting the defective memory locations according to the information. The redundant memory decoder module includes at least one of a row decoder, a column decoder, a bank decoder, and an input/output (I/O) decoder that forms associations between the memory addresses and the redundant memory elements according to the information. The computer program further comprises integrating the redundant memory decoder module, the memory module, and the memory control module on an SOC.

In still other features, the systems and methods described above are implemented by a computer program executed by one or more processors. The computer program can reside on a computer readable medium such as but not limited to memory, non-volatile data storage and/or other suitable tangible storage mediums.

Further areas of applicability of the present invention will become apparent from the detailed description provided hereinafter. It should be understood that the detailed description and specific examples, while indicating the preferred embodiment of the invention, are intended for purposes of illustration only and are not intended to limit the scope of the invention.

BRIEF DESCRIPTION OF THE DRAWINGS

The present invention will become more fully understood from the detailed description and the accompanying drawings, wherein.

DETAILED DESCRIPTION OF THE PREFERRED EMBODIMENTS

Figure 1:
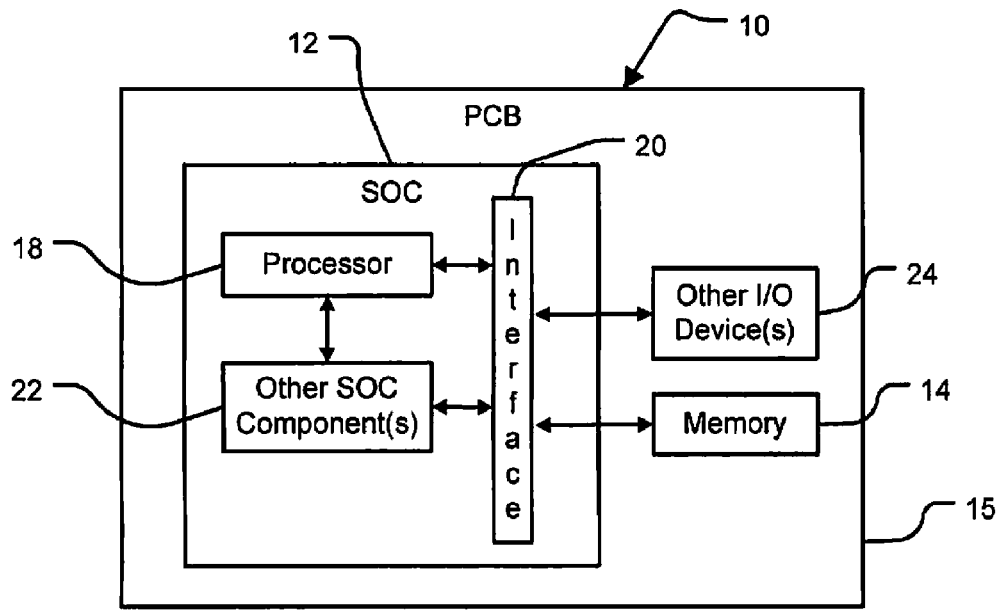
FIG. 1 is a functional block diagram of an exemplary memory system according to the prior art.
Figure 2:
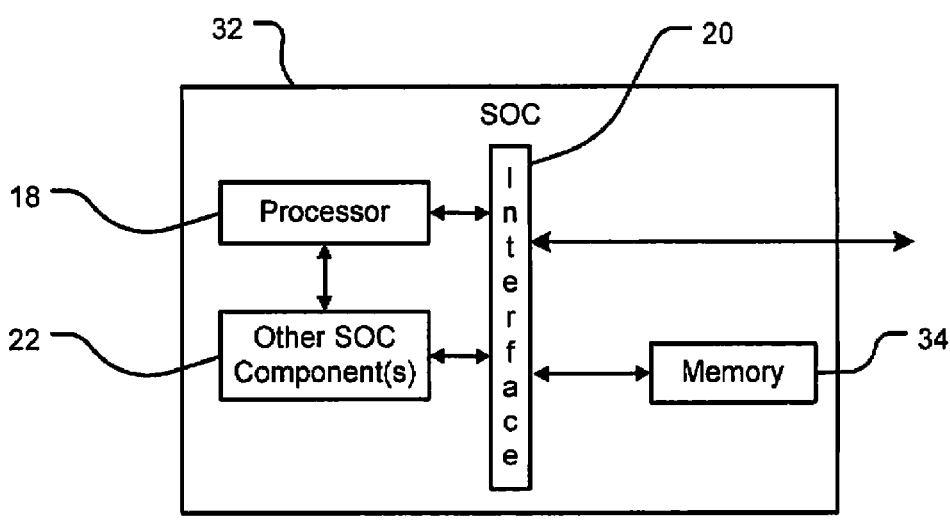
FIG. 2 is a functional block diagram of an exemplary memory system according to the prior art.
Figure 3:
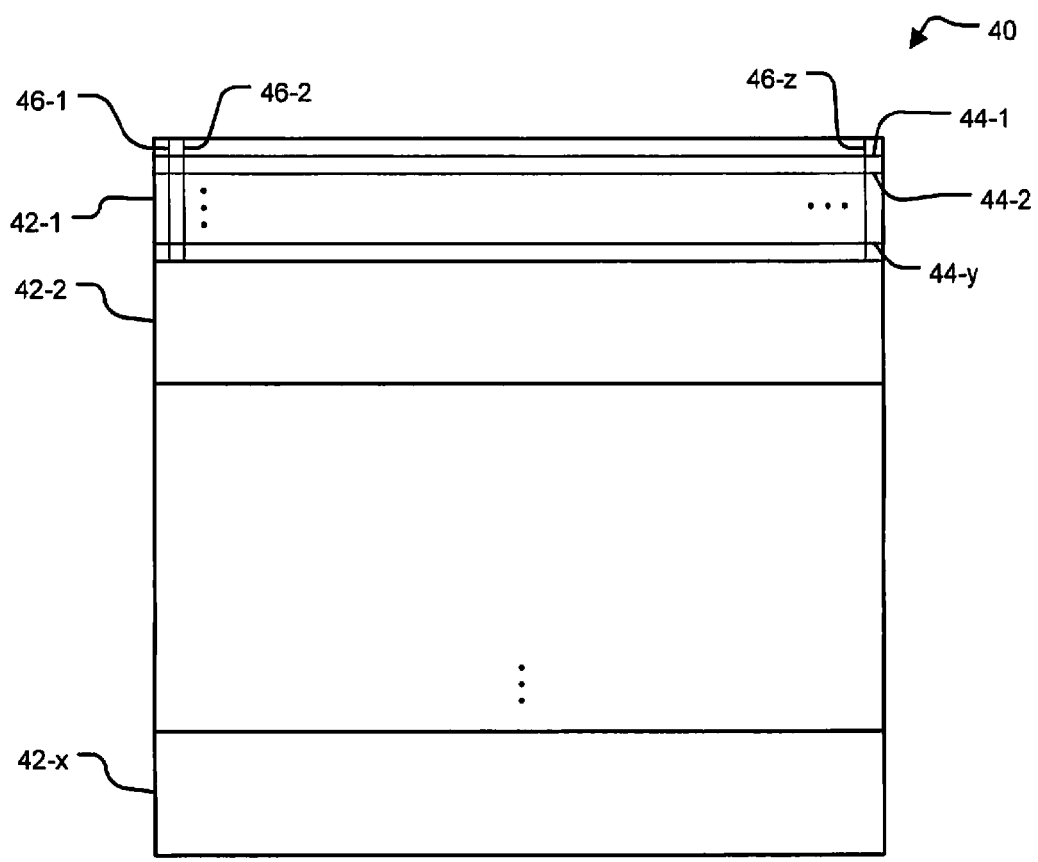
FIG. 3 is a functional block diagram of a memory module according to the prior art.

The following description of the preferred embodiment(s) is merely exemplary in nature and is in no way intended to limit the invention, its application, or uses. For purposes of clarity, the same reference numbers will be used in the drawings to identify similar elements. As used herein, the term module, circuit and/or device refers to an Application Specific Integrated Circuit (ASIC), an electronic circuit, a processor (shared, dedicated, or group) and memory that execute one or more software or firmware programs, a combinational logic circuit, and/or other suitable components that provide the described functionality. As used herein, the phrase at least one of A, B, and C should be construed to mean a logical (A or B or C), using a non-exclusive logical or. It should be understood that steps within a method may be executed in different order without altering the principles of the present invention.

The present invention increases memory yield and the reliability of computing devices. A memory module according to the present invention includes redundant memory elements (e.g. redundant memory rows, columns, blocks, and banks) as described above. Further, the computing device or system on chip (SOC) that includes the memory module also includes a memory control module that detects latent defects in the memory module and triggers a memory repair operation. In this manner, memory defects can be repaired during manufacturing, after manufacturing, and/or after sale and use.

Figure 7:
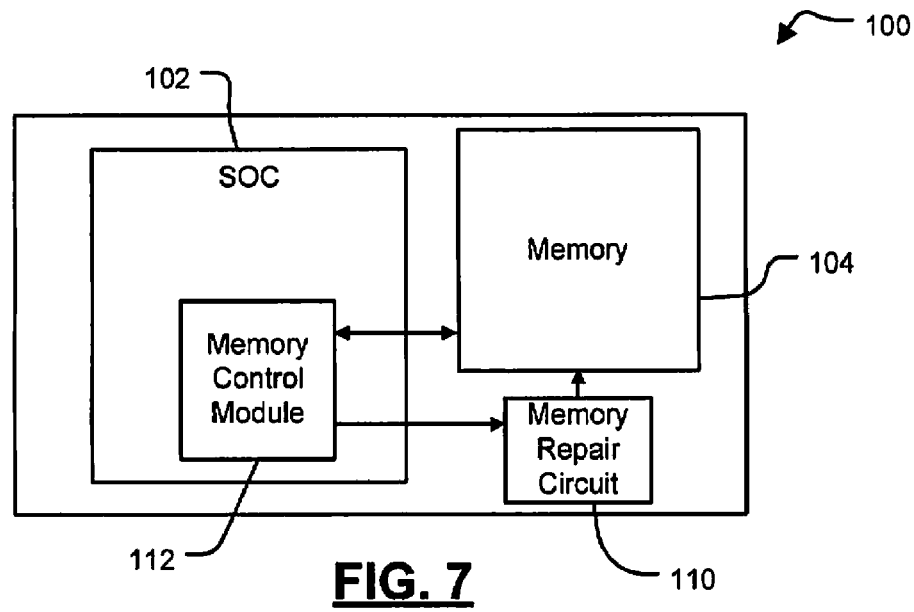
FIG. 7 is a functional block diagram of a memory repair system that includes electric fuses according to the present invention.
Figure 8:
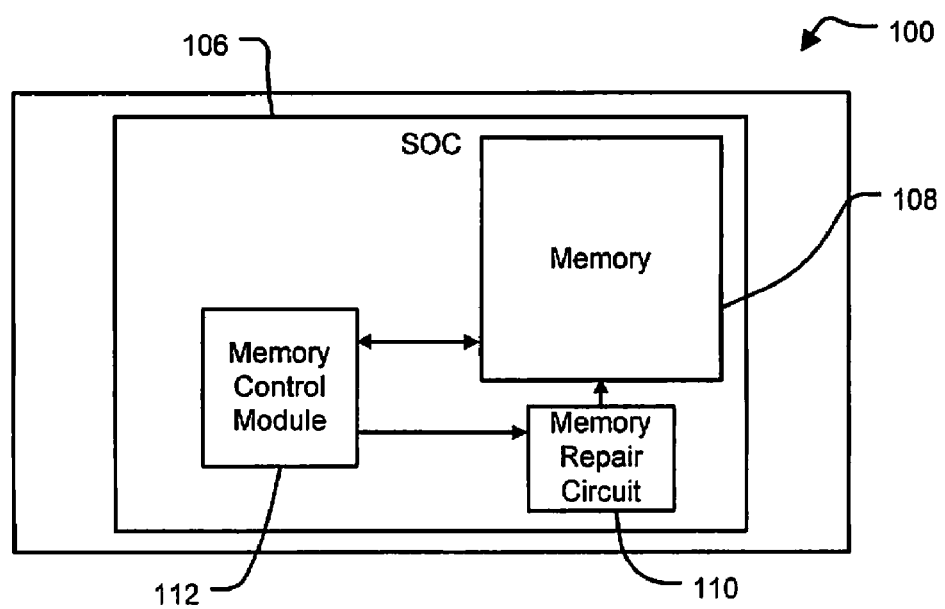
FIG. 8 is a functional block diagram of a memory repair system that includes electric fuses and an SOC-embedded memory module according to the present invention.

Referring now to FIGS. 7 and 8, a computing device 100 that includes a memory self-repair system according to the present invention is shown. In FIG. 7, the computing device 100 includes an SOC 102 and a memory module 104 that is separate from the SOC 102. Alternatively in FIG. 8, the computing device 100 may include an SOC 106 that includes an embedded memory module 108.

In FIG. 7, the memory module 104 includes redundant memory elements as described above. For example, the memory module 104 includes redundant address rows and columns, memory banks, and/or memory blocks. The computing device 100 further includes a memory repair circuit 110 and a memory control module 112. The memory repair circuit 110 and/or the memory control module 112 may be integrated with the SOC 102 as shown, with the memory module 104, and/or another component of the computing device 100.

Figure 4A:
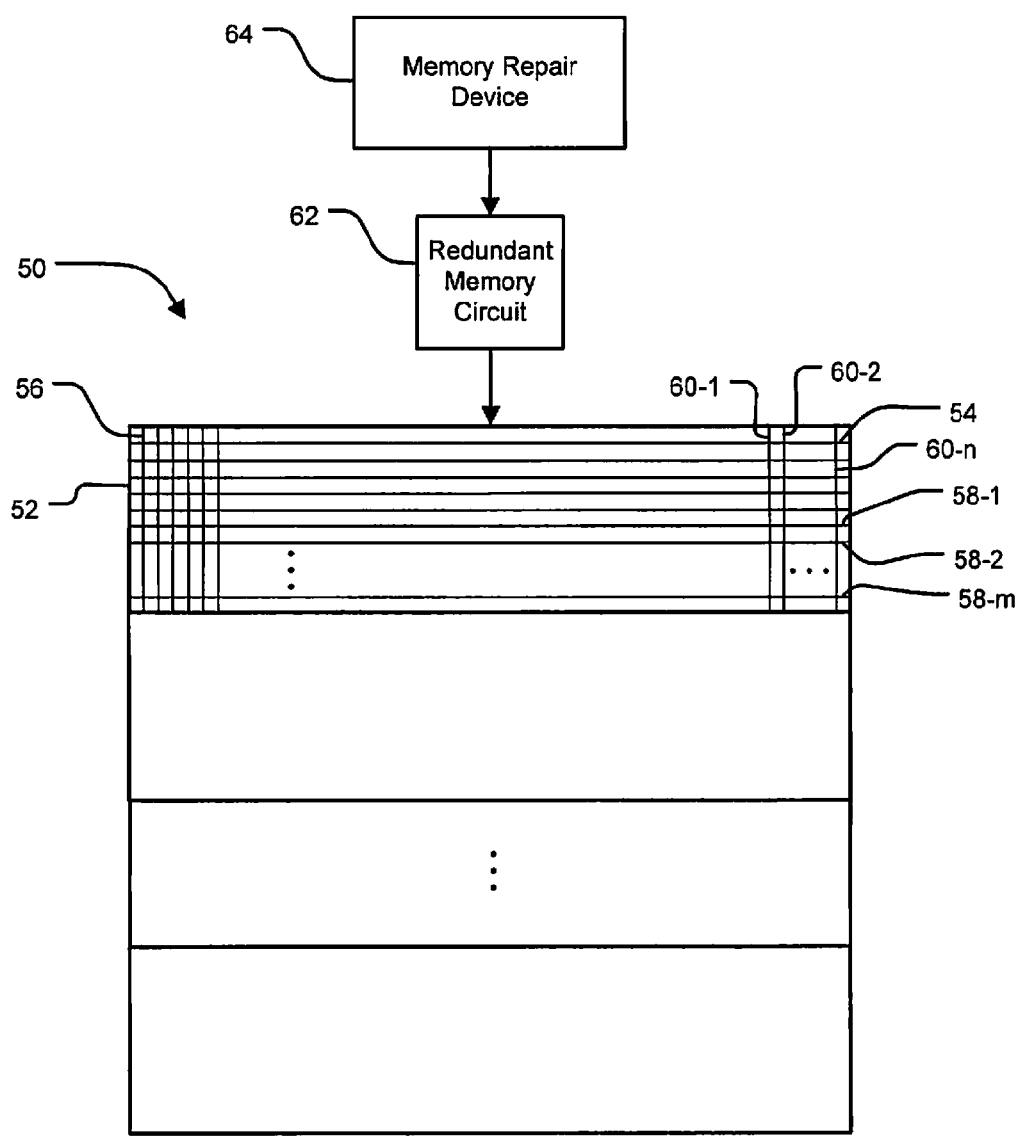
FIG. 4A is a functional block diagram of a memory module including redundant rows and columns according to the prior art.
Figure 4B:
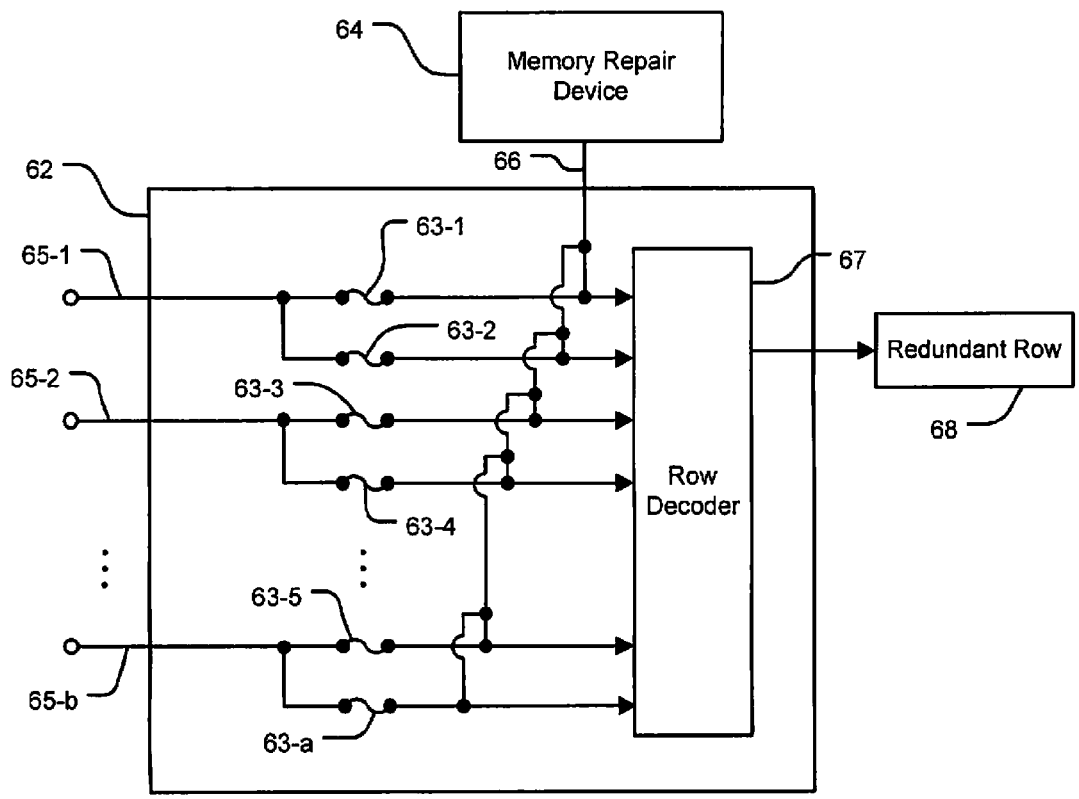
FIG. 4B is a functional block diagram of a redundant memory circuit that includes fuses according to the prior art.
Figure 5:
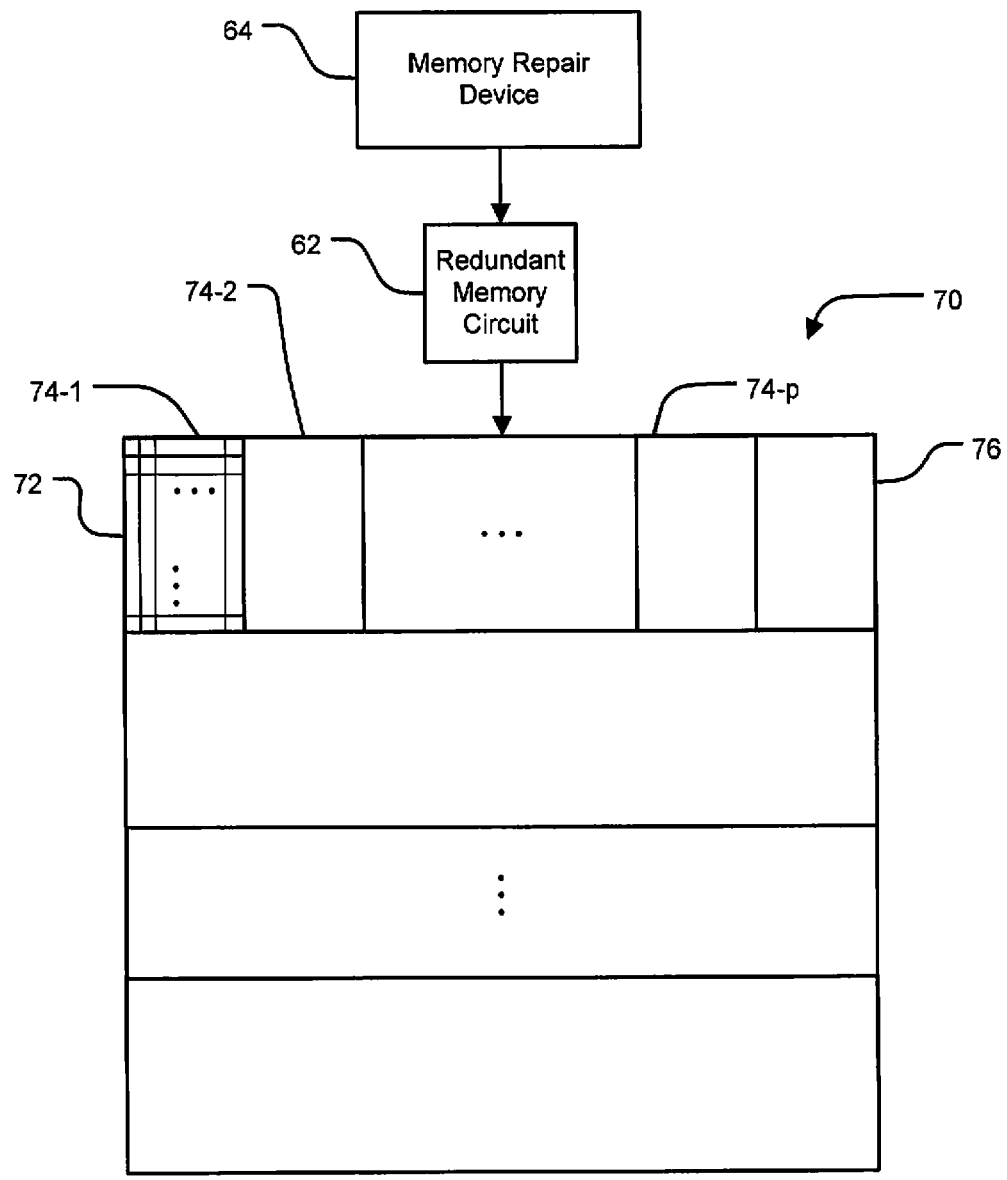
FIG. 5 is a functional block diagram of a memory module including a redundant memory block according to the prior art.
Figure 6:
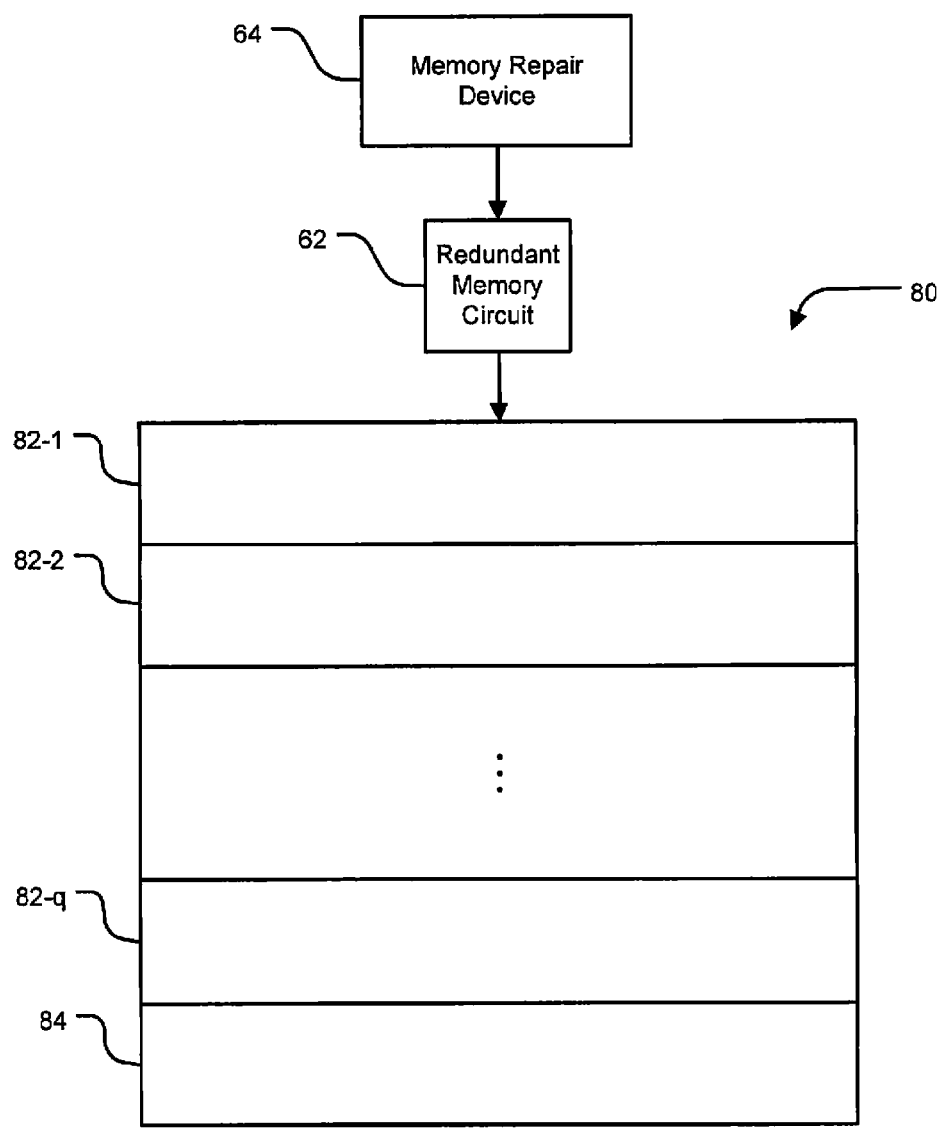
FIG. 6 is a functional block diagram of a memory module including a redundant memory bank according to the prior art.

The memory module 104 may include fuse elements as described in FIGS. 4A and 4B. The fuse elements and the memory repair circuit 110 can be used to perform a memory repair operation during the memory manufacturing processes (i.e. during wafer sort and final test steps). In addition to the conventional memory repair elements, the computing device 100 is able to self-test and repair memory defects after sale. For example, the memory control module 112 communicates with and tests the memory module 104 to detect memory defects. The memory control module 112 then initiates a repair mechanism by invoking the memory repair circuit 110 to repair the memory defects. The memory control module 112 detects and repairs the memory defects at any time during and/or after manufacturing of the computing device 100. Therefore, an external memory repair device is not required.

In a first implementation, the computing device 100 includes the memory repair circuit 110 and the memory module 104 includes electrical fuses. The memory control module 112 tests the memory module 104 to detect memory defects. For example, an external tester may be connected to the memory control module 112 during manufacturing to direct the memory control module 112 to perform detect and repair functions. Alternatively or additionally, the memory control module 112 may execute memory test and repair software. The memory test and repair software may execute detect and/or repair functions conditionally, at power-up, and/or when triggered by a user. When the memory control module 112 detects a memory defect, the memory control module 112 triggers the memory repair circuit 110 to blow electrical fuses as necessary to re-associate memory addresses with redundant memory elements.

Figure 9:
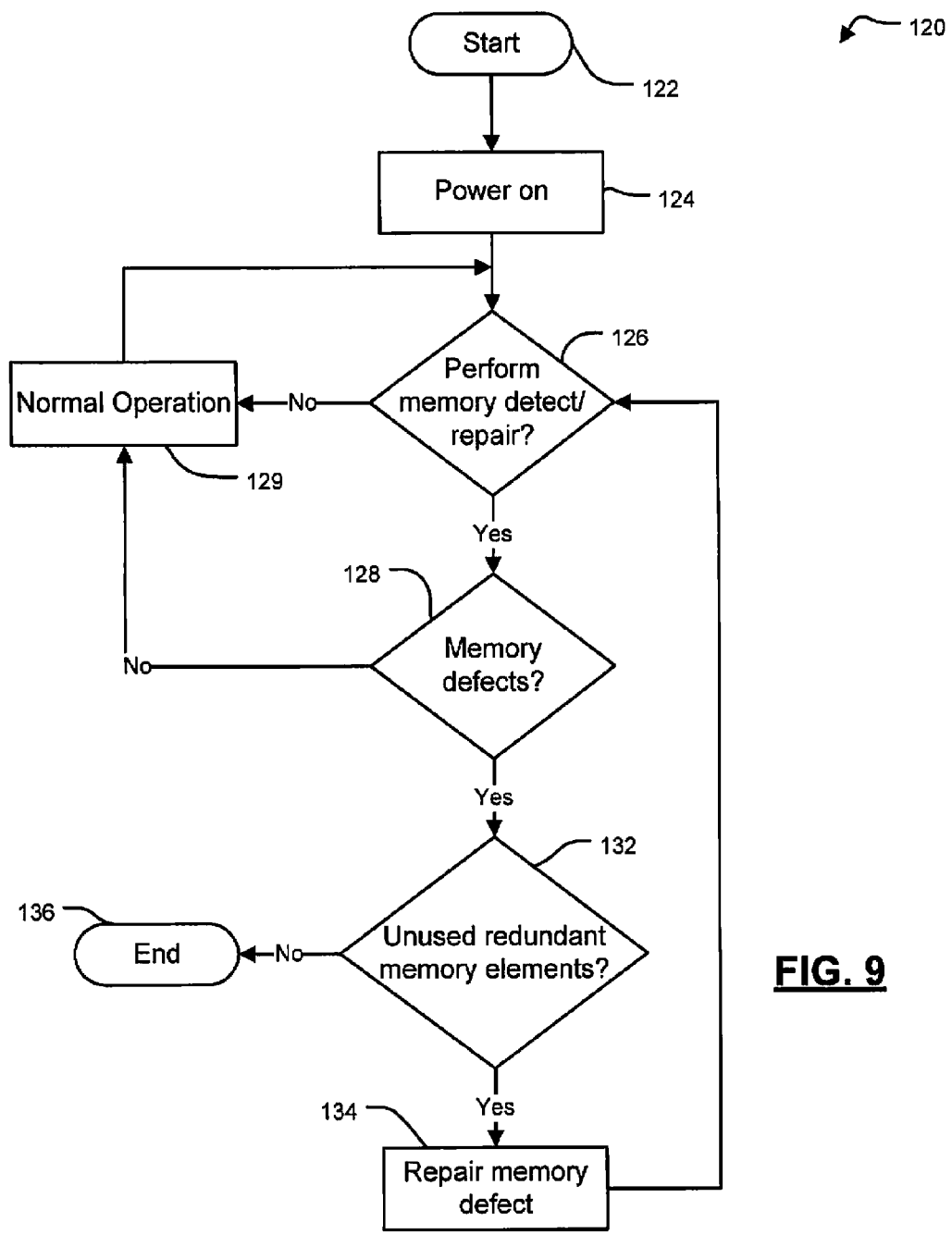
FIG. 9 is a flow diagram that illustrates steps of a memory repair method according to a first implementation of the present invention.

Referring now to FIG. 9, steps performed by the memory control module 112 to implement a memory repair method 120 are shown. The memory repair method starts in step 122. In step 124, the computing device 100 is powered on. In step 126, the method 120 determines whether to perform the memory failure detect and repair functions. As described above, the method 120 may perform the memory failure detect and repair functions at power-up, conditionally, periodically, and/or when triggered by a user of system software. If step 126 is true, the method 120 continues to step 128. If step 126 is false, the method 120 continues to step 129.

In step 129, the computing device 100 resumes normal operation. The method 120 may return to step 126 to perform additional memory failure detect and repair functions as described above (i.e. conditionally, periodically, and/or when triggered by the user). In step 128, the method 120 determines whether the memory module 104 has any memory defects. If step 128 is true, the method 120 continues with step 132. If step 128 is false, the method 120 continues to step 129. In step 132, the method 120 determines whether there are any unused redundant memory elements. If true, the method 120 continues to step 134 and repairs the memory defects. If false, the method 120 terminates at step 136. For example, a system fault flag may be generated to notify the system and/or user that the system has a non-recoverable memory failure condition.

In step 134, the method 120 performs a memory repair operation. For example, the method 120 directs the memory control module 112 to adjust one or more electrical fuses to re-associate a memory address of the defective memory location with a redundant memory element. After repairing the memory defect, the method 120 continues with step 126 to continue to test the memory module 104 for potential additional memory defects.

Figure 10:
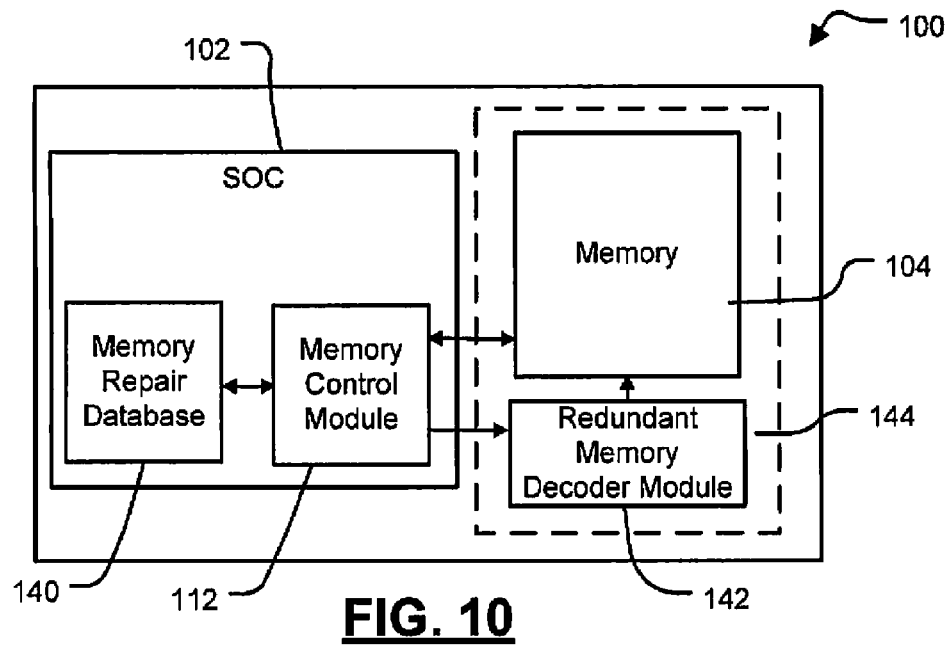
FIG. 10 is a functional block diagram of a memory repair system that includes a memory repair database according to the present invention.
Figure 11:
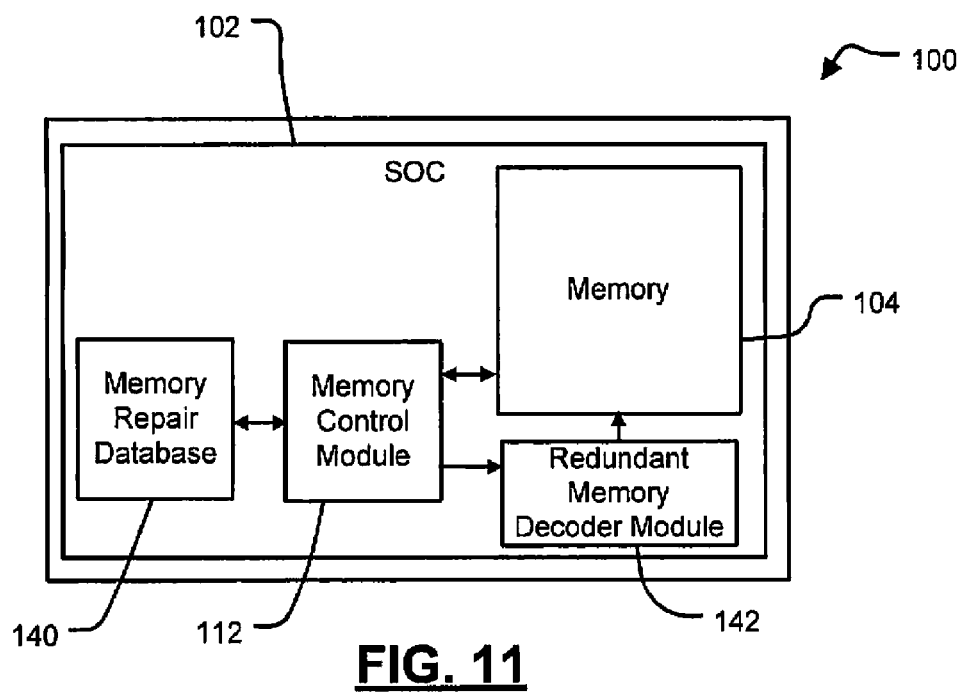
FIG. 11 is a functional block diagram of a memory repair system that includes a memory repair database and an SOC-embedded memory module according to the present invention.

Referring now to FIGS. 10 and 11, the computing device 100 does not include the memory repair circuit 110. Further, the memory module 104 includes redundant memory elements. The memory module 104 may include electrical fuses and/or the laser fuses for conventional memory repairs during the manufacturing process as described in FIGS. 1 through 6. Further, the memory module 104 includes additional repair resources, such as rows, columns, blocks, and/or banks that are allocated for use for repair during manufacturing and/or after sale.

The SOC 102 includes a memory repair database 140. The memory control module 112 detects memory defects according to previously described implementations. When the memory control module 112 detects a memory defect, the memory control module 112 stores the memory defect information in the memory repair database 140. Further, the memory control module 112 locates an alternative memory location (i.e. a redundant memory element). The memory control module 112 stores the redundant memory element information in the memory repair database 140. In another implementation, the memory module 104 and the redundant memory decoder module 142 may be integrated on a single module as indicated at 144.

The computing device 100 includes a redundant memory decoder module 142. Alternatively, the redundant memory decoder module 142 may be located on the SOC 102 or embedded within the memory module 104. For example, the memory module 104 and the redundant memory decoder module 142 may be integrated on a single module as indicated at 144. The memory control module 112 communicates the memory defect and redundant memory element information to the redundant memory decoder module 142. In other words, the memory control module 112 communicates memory addresses of each of the defective memory locations, as well as corresponding redundant memory elements that replace the defective memory locations, to the memory logic repair module 142. The redundant memory decoder module 142 replaces the defective memory elements with the redundant memory elements. For example, the redundant memory decoder module 142 may implement redundant row decoders, column decoders, bank decoders, and/or redundant input/output (I/O) decoders as described in FIG. 4B. In this manner, the redundant memory decoder module 142 re-associates the memory addresses with the redundant memory elements.

The information stored in the memory repair database 140 is lost when the computing device 100 is powered down. When the computing device 100 is subsequently powered on, the memory control module 112 again detects memory defects, locates redundant memory elements, and stores the information in the memory repair database 140. The memory control module 112 repeats this procedure at each power up.

Figure 12:
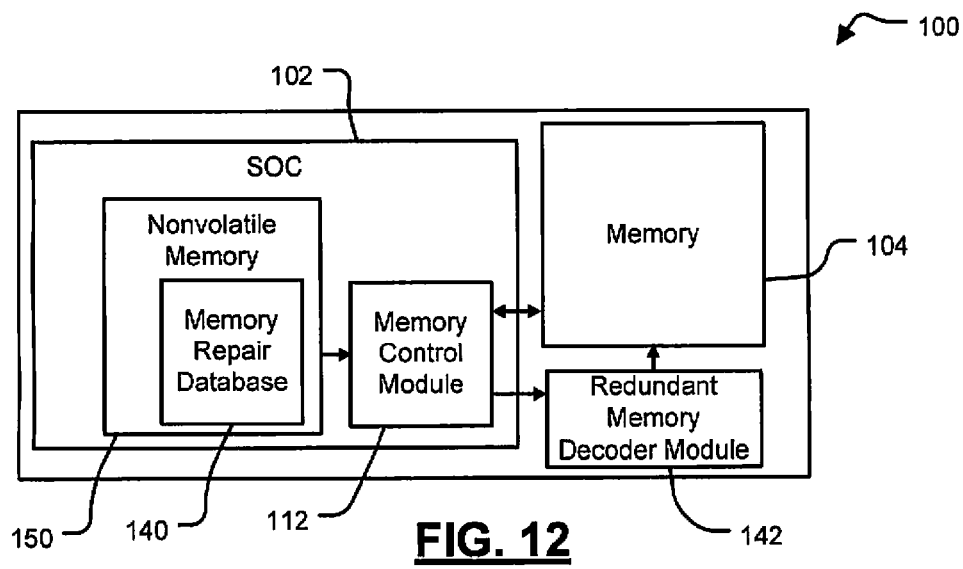
FIG. 12 is a functional block diagram of a memory repair system that includes a memory repair database in a non-volatile memory location according to the present invention.
Figure 13:
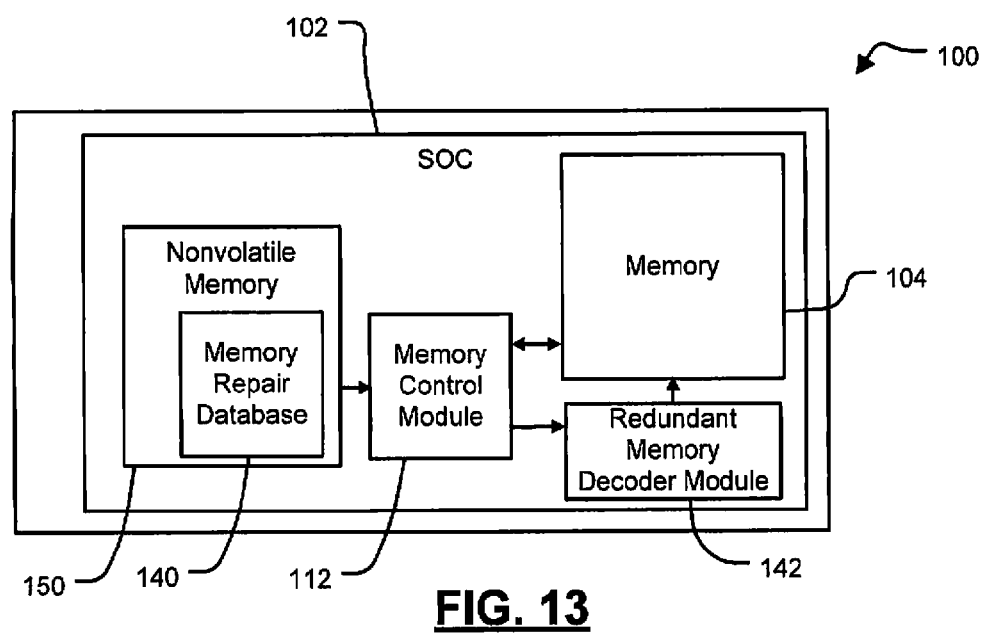
FIG. 13 is a functional block diagram of a memory repair system that includes a memory repair database in a non-volatile memory location and an SOC-embedded memory module according to the present invention.

Referring now to FIGS. 12 and 13, the memory repair database 140 is stored in a non-volatile memory module 150, such as in a one-time programmable (OTP) memory module, EPROM module, EEPROM module, and/or flash memory module. The memory control module 112 detects memory defects and locates redundant memory elements as described previously. The memory control module 112 stores the memory defect and redundant memory element information in the memory repair database 140 located in the non-volatile memory module 150. The information in the memory repair database 140 is maintained when the computing device 100 is powered down.

Therefore, after the subsequent power up, it is not necessary to repeat the memory failure detect and repair process. The repair information is read directly from the memory repair database 140, then loaded to the redundant memory decoder module 142 to enable the memory repair. Although the non-volatile memory module 150 as shown is located on the SOC 102, the non-volatile memory module 150 may be located on the memory control module 112 or elsewhere on the computing device 100. In another implementation, the memory repair database 140 may be a standalone device that is separate from, but accessible by, the computing device 100.

In still another implementation, the memory control module 112 may include electronic fuses. When the memory control module 112 detects memory defects, the memory control module 112 (and/or the SOC 102) blows the electrical fuses to permanently store the memory defect information in the memory control module 112.

Figure 14:
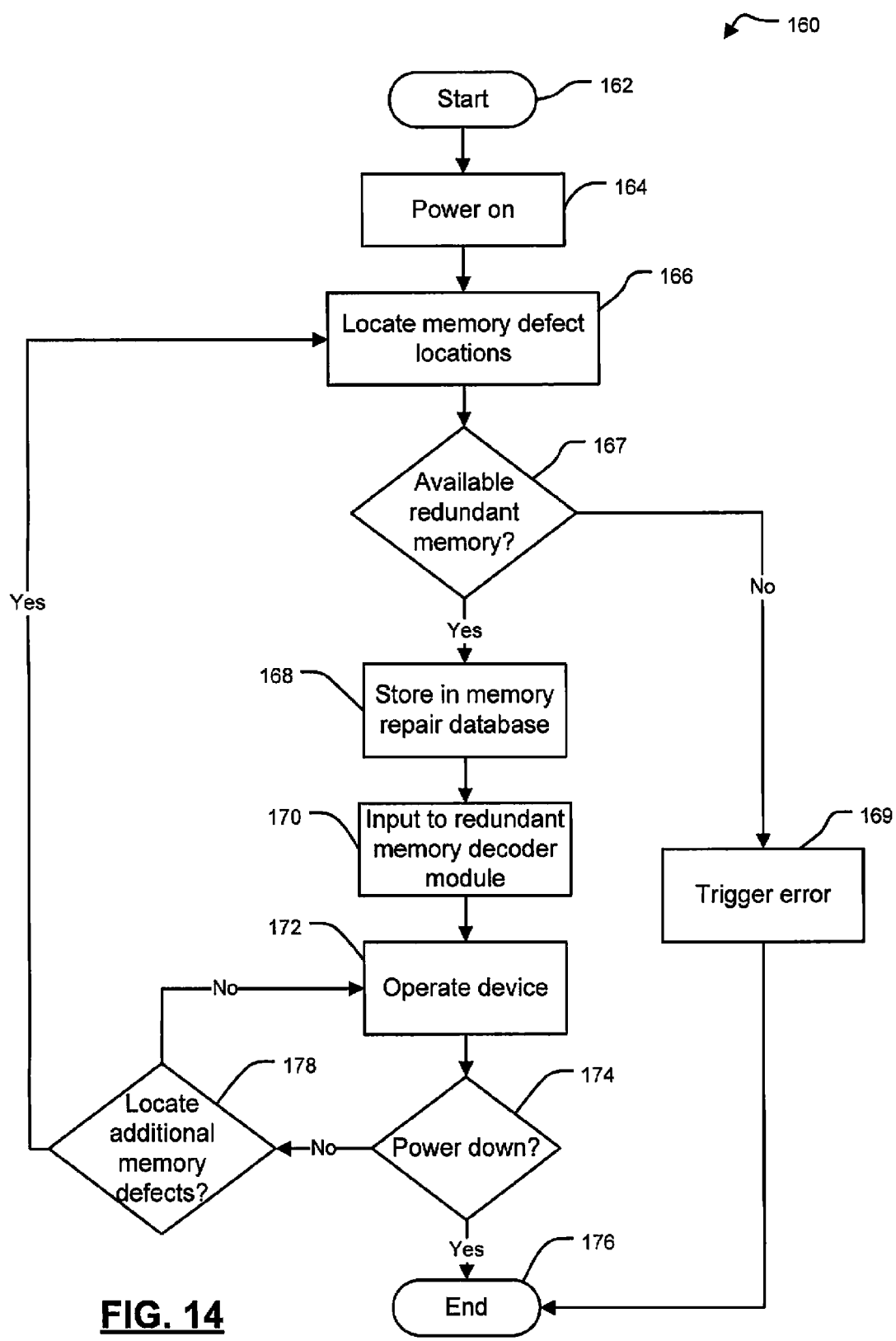
FIG. 14 is a flow diagram that illustrates steps of a memory repair method according to a second implementation of the present invention.

Referring now to FIG. 14, a first memory repair method 160 is described. The memory repair method 160 starts in step 162. In step 164, the computing device 100 powers on. In step 166, the method 160 locates memory defect locations. For example, the method 160 may execute step 166 periodically, conditionally, and/or upon system or user request. In step 167, the method 160 determines whether there are available redundant memory locations. If step 167 is true, the method 160 continues with step 168. If step 167 is false, the method 160 continues with step 169. In step 169, the method 160 triggers an error in the computing device 100 and terminates. For example, the method 160 may indicate that the memory 104 is defective and therefore unusable.

In step 168, the method 160 stores memory addresses associated with the memory defect locations, as well as corresponding available redundant memory elements, in the memory repair database 140 located in a volatile memory module. In other words, the method 160 stores information that re-associates the memory address with available redundant memory locations.

In step 170, the method 160 inputs the memory addresses and the corresponding available redundant memory elements to the redundant memory decoder module 142. In step 172, the computing device 100 operates according to its normal operation functions.

In step 174, the method 160 determines whether to power down. If step 174 is true, the method 160 continues with step 176. If step 174 is false, the method 160 continues with step 178. In step 178, the method 160 determines whether to locate additional memory defect locations. For example, the method 160 may locate additional memory defect locations periodically, conditionally, and/or according to system or user requests. If step 178 is true, the method 160 returns to step 166. If step 178 is false, the method 160 returns to step 172. Accordingly, the method 160 relocates all memory defect locations and available redundant memory locations at each power up, periodically, and/or upon system or user request.

Figure 15:
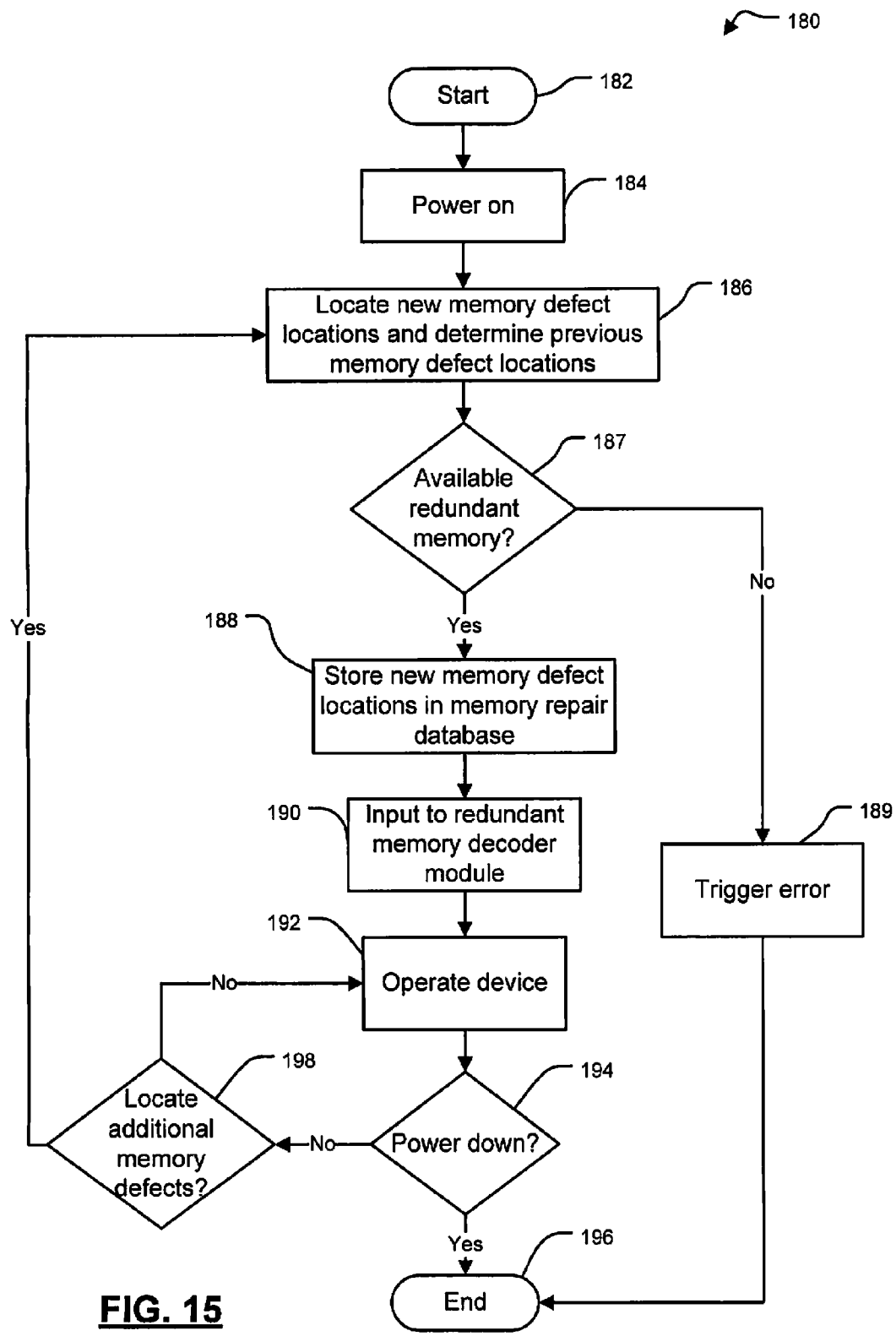
FIG. 15 is a flow diagram that illustrates steps of a memory repair method according to a third implementation of the present invention.

Referring now to FIG. 15, a second memory repair method 180 is described. The memory repair method 180 starts in step 182. In step 184, the computing device 100 powers on. In step 186, the method 180 locates new memory defect locations and communicates with the memory repair database 140 to determine previously stored memory defect information. For example, the memory repair database 140 stores memory addresses associated with memory defect locations and associated redundant memory elements. The memory repair database 140 is located in a non-volatile memory location.

In step 187, the method 180 determines whether there are available redundant memory locations to associate with the new memory defect locations. If step 187 is true, the method 180 continues with step 188. If step 187 is false, the method 180 continues with step 189. In step 189, the method 180 triggers an error in the computing device 100 and powers down. For example, the method 180 may indicate that the memory 104 is defective and therefore unusable.

In step 188, the method 180 stores the new memory defect locations, as well as corresponding available redundant memory elements, in the memory repair database 140. In step 190, the method 180 inputs the memory addresses and the associated redundant memory elements to the redundant memory decoder module 142. In step 192, the computing device 100 operates according to its normal operating functions.

In step 194, the method 180 determines whether to power down. If step 194 is true, the method 180 continues to step 196. If step 194 is false, the method 180 continues to step 198. In step 198, the method 180 determines whether to locate additional memory defect locations. For example, the method 190 may locate additional memory defect locations periodically, conditionally, and/or according to system or user requests. If step 198 is true, the method 180 returns to step 186. If step 198 is false, the method 180 returns to step 192. Accordingly, the method 180 stores known memory defect locations and associated redundant memory locations between after powering down. The method 180 locates new memory defect locations and available redundant memory locations at each power up, periodically, and/or upon system or user requests.

The present invention can be applied to any memory technology that implements addressed memory locations. For example, the present invention can be applied to memory technologies including, but not limited to, DRAM, SRAM, EPROM, EEPROM, flash memory, and MRAM, as well as any derivative of the above memory technologies, such as FCRAM.

Figure 16B:
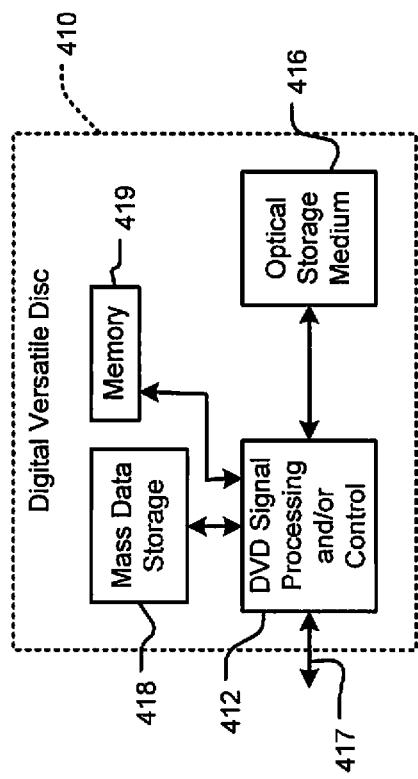
FIG. 16B is a functional block diagram of a digital versatile disk (DVD)
Figure 16A:
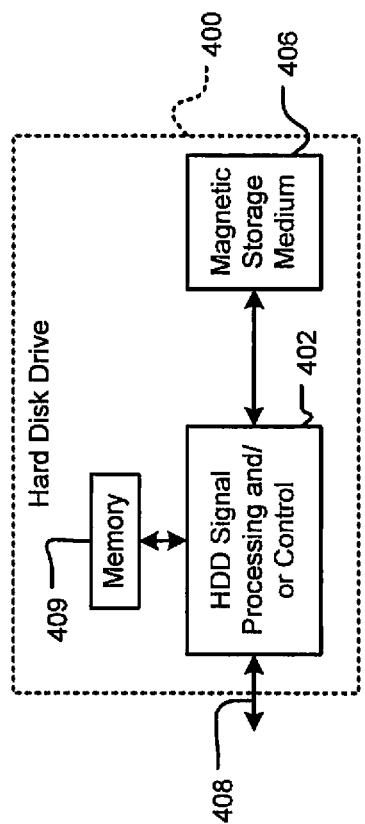
FIG. 16A is a functional block diagram of a hard disk drive.

Referring now to FIGS. 16A-16G, various exemplary implementations of the present invention are shown. Referring now to FIG. 16A, the present invention can be implemented in a hard disk drive 400. The present invention may implement memory in FIG. 16A. In some implementations, the signal processing and/or control circuit 402 and/or other circuits (not shown) in the HDD 400 may process data, perform coding and/or encryption, perform calculations, and/or format data that is output to and/or received from a magnetic storage medium 406.

The HDD 400 may communicate with a host device (not shown) such as a computer, mobile computing devices such as personal digital assistants, cellular phones, media or MP3 players and the like, and/or other devices via one or more wired or wireless communication links 408. The HDD 400 may be connected to memory 409 such as random access memory (RAM), low latency nonvolatile memory such as flash memory, read only memory (ROM) and/or other suitable electronic data storage.

Referring now to FIG. 16B, the present invention can be implemented in a digital versatile disc (DVD) drive 410. The present invention may implement memory in FIG. 16B. The signal processing and/or control circuit 412 and/or other circuits (not shown) in the DVD 410 may process data, perform coding and/or encryption, perform calculations, and/or format data that is read from and/or data written to an optical storage medium 416. In some implementations, the signal processing and/or control circuit 412 and/or other circuits (not shown) in the DVD 410 can also perform other functions such as encoding and/or decoding and/or any other signal processing functions associated with a DVD drive.

The DVD drive 410 may communicate with an output device (not shown) such as a computer, television or other device via one or more wired or wireless communication links 417. The DVD 410 may communicate with mass data storage 418 that stores data in a nonvolatile manner. The mass data storage 418 may include a hard disk drive (HDD). The HDD may have the configuration shown in FIG. 16A. The HDD may be a mini HDD that includes one or more platters having a diameter that is smaller than approximately 1.8". The DVD 410 may be connected to memory 419 such as RAM, ROM, low latency nonvolatile memory such as flash memory and/or other suitable electronic data storage.

Figure 16D:
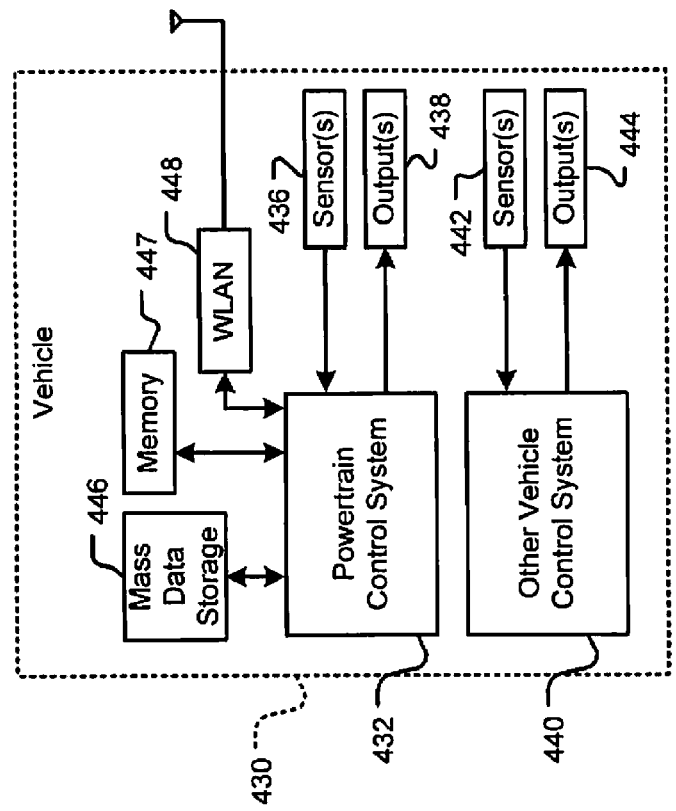
FIG. 16D is a functional block diagram of a vehicle control system.
Figure 16C:
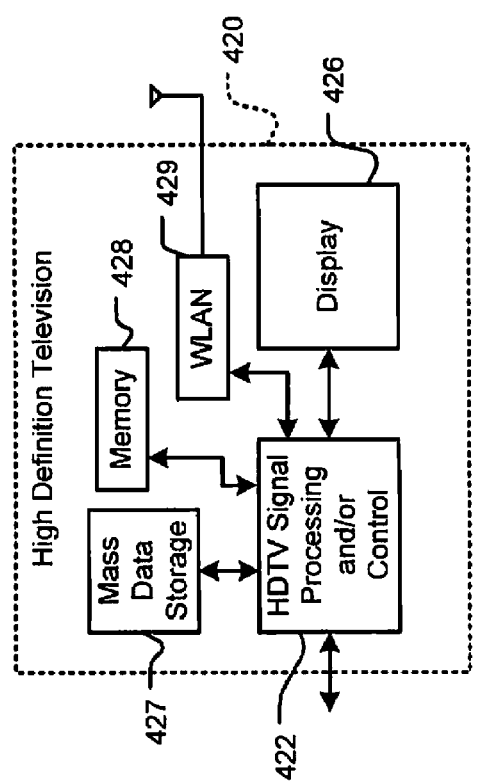
FIG. 16C is a functional block diagram of a high definition television.

Referring now to FIG. 16C, the present invention can be implemented in a high definition television (HDTV) 420. The present invention may implement memory in FIG. 16E. The HDTV 420 receives HDTV input signals in either a wired or wireless format and generates HDTV output signals for a display 426. In some implementations, signal processing circuit and/or control circuit 422 and/or other circuits (not shown) of the HDTV 420 may process data, perform coding and/or encryption, perform calculations, format data and/or perform any other type of HDTV processing that may be required.

The HDTV 420 may communicate with mass data storage 427 that stores data in a nonvolatile manner such as optical and/or magnetic storage devices. At least one HDD may have the configuration shown in FIG. 16A and/or at least one DVD may have the configuration shown in FIG. 16B. The HDD may be a mini HDD that includes one or more platters having a diameter that is smaller than approximately 1.8". The HDTV 420 may be connected to memory 428 such as RAM, ROM, low latency nonvolatile memory such as flash memory and/or other suitable electronic data storage. The HDTV 420 also may support connections with a WLAN via a WLAN network interface 429.

Referring now to FIG. 16D, the present invention implements memory of a control system of a vehicle 430, a WLAN interface and/or mass data storage of the vehicle control system. In some implementations, the present invention implement a powertrain control system 432 that receives inputs from one or more sensors such as temperature sensors, pressure sensors, rotational sensors, airflow sensors and/or any other suitable sensors and/or that generates one or more output control signals such as engine operating parameters, transmission operating parameters, and/or other control signals.

The present invention may also be implemented in other control systems 440 of the vehicle 430. The control system 440 may likewise receive signals from input sensors 442 and/or output control signals to one or more output devices 444. In some implementations, the control system 440 may be part of an anti-lock braking system (ABS), a navigation system, a telematics system, a vehicle telematics system, a lane departure system, an adaptive cruise control system, a vehicle entertainment system such as a stereo, DVD, compact disc and the like. Still other implementations are contemplated.

The powertrain control system 432 may communicate with mass data storage 446 that stores data in a nonvolatile manner. The mass data storage 446 may include optical and/or magnetic storage devices for example hard disk drives HDD and/or DVDs. At least one HDD may have the configuration shown in FIG. 16A and/or at least one DVD may have the configuration shown in FIG. 16B. The HDD may be a mini HDD that includes one or more platters having a diameter that is smaller than approximately 1.8". The powertrain control system 432 may be connected to memory 447 such as RAM, ROM, low latency nonvolatile memory such as flash memory and/or other suitable electronic data storage. The powertrain control system 432 also may support connections with a WLAN via a WLAN network interface 448. The control system 440 may also include mass data storage, memory and/or a WLAN interface (all not shown).

Figure 16E:
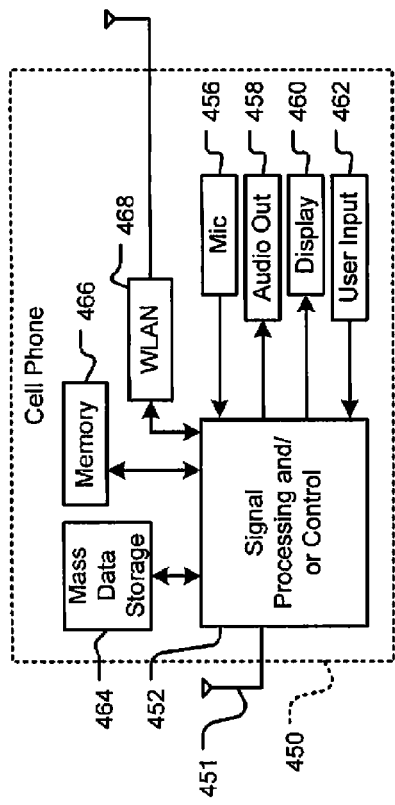
FIG. 16E is a functional block diagram of a cellular phone.

Referring now to FIG. 16E, the present invention can be implemented in a cellular phone 450 that may include a cellular antenna 451. The present invention may implement memory in FIG. 16E. In some implementations, the cellular phone 450 includes a microphone 456, an audio output 458 such as a speaker and/or audio output jack, a display 460 and/or an input device 462 such as a keypad, pointing device, voice actuation and/or other input device. The signal processing and/or control circuits 452 and/or other circuits (not shown) in the cellular phone 450 may process data, perform coding and/or encryption, perform calculations, format data and/or perform other cellular phone functions.

The cellular phone 450 may communicate with mass data storage 464 that stores data in a nonvolatile manner such as optical and/or magnetic storage devices for example hard disk drives HDD and/or DVDs. At least one HDD may have the configuration shown in FIG. 16A and/or at least one DVD may have the configuration shown in FIG. 16B. The HDD may be a mini HDD that includes one or more platters having a diameter that is smaller than approximately 1.8". The cellular phone 450 may be connected to memory 466 such as RAM, ROM, low latency nonvolatile memory such as flash memory and/or other suitable electronic data storage. The cellular phone 450 also may support connections with a WLAN via a WLAN network interface 468.

Figure 16F:
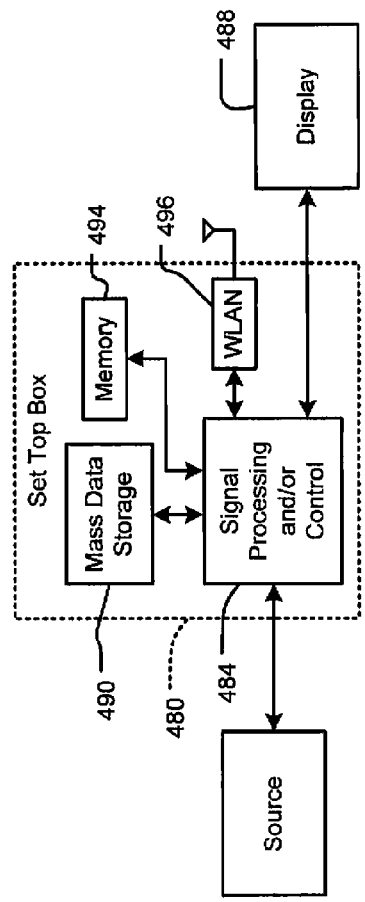
FIG. 16F is a functional block diagram of a set top box.

Referring now to FIG. 16F, the present invention can be implemented in a set top box 480. The present invention may implement memory in FIG. 16F. The set top box 480 receives signals from a source such as a broadband source and outputs standard and/or high definition audio/video signals suitable for a display 488 such as a television and/or monitor and/or other video and/or audio output devices. The signal processing and/or control circuits 484 and/or other circuits (not shown) of the set top box 480 may process data, perform coding and/or encryption, perform calculations, format data and/or perform any other set top box function.

The set top box 480 may communicate with mass data storage 490 that stores data in a nonvolatile manner. The mass data storage 490 may include optical and/or magnetic storage devices for example hard disk drives HDD and/or DVDs. At least one HDD may have the configuration shown in FIG. 16A and/or at least one DVD may have the configuration shown in FIG. 16B. The HDD may be a mini HDD that includes one or more platters having a diameter that is smaller than approximately 1.8". The set top box 480 may be connected to memory 494 such as RAM, ROM, low latency nonvolatile memory such as flash memory and/or other suitable electronic data storage. The set top box 480 also may support connections with a WLAN via a WLAN network interface 496.

Figure 16G:
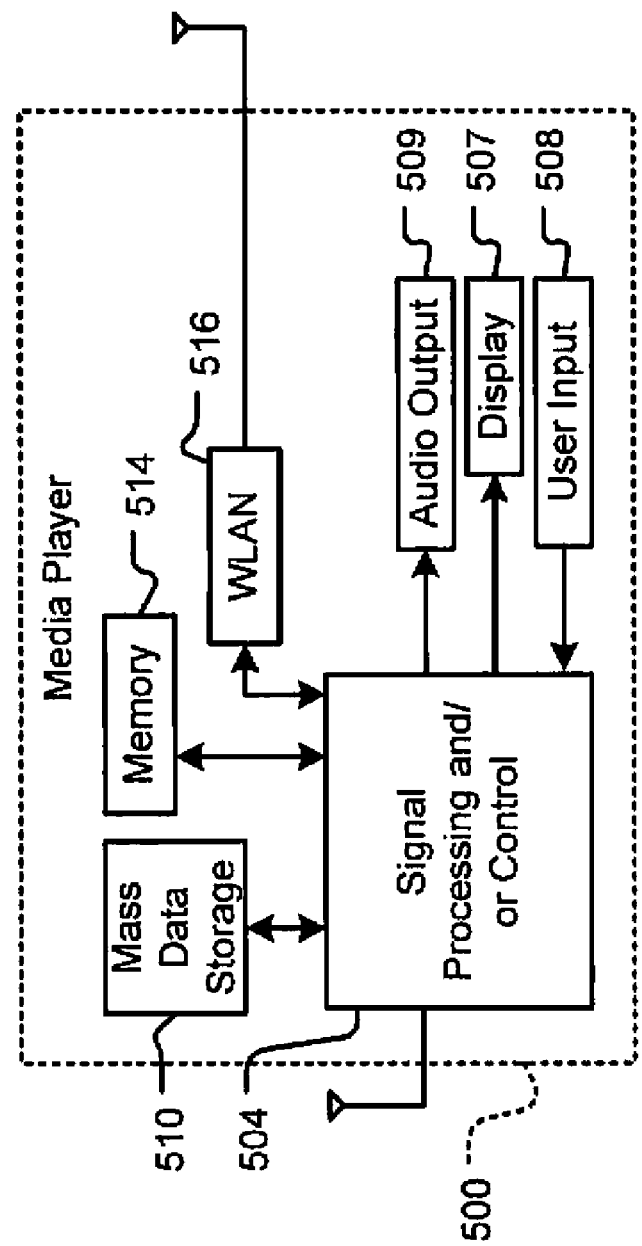
FIG. 16G is a functional block diagram of a media player.

Referring now to FIG. 16G, the present invention can be implemented in a media player 500. The present invention may implement memory in FIG. 16G. In some implementations, the media player 500 includes a display 507 and/or a user input 508 such as a keypad, touchpad and the like. In some implementations, the media player 500 may employ a graphical user interface (GUI) that typically employs menus, drop down menus, icons and/or a point-and-click interface via the display 507 and/or user input 508. The media player 500 further includes an audio output 509 such as a speaker and/or audio output jack. The signal processing and/or control circuits 504 and/or other circuits (not shown) of the media player 500 may process data, perform coding and/or encryption, perform calculations, format data and/or perform any other media player function.

The media player 500 may communicate with mass data storage 510 that stores data such as compressed audio and/or video content in a nonvolatile manner. In some implementations, the compressed audio files include files that are compliant with MP3 format or other suitable compressed audio and/or video formats. The mass data storage may include optical and/or magnetic storage devices for example hard disk drives HDD and/or DVDs. At least one HDD may have the configuration shown in FIG. 16A and/or at least one DVD may have the configuration shown in FIG. 16B. The HDD may be a mini HDD that includes one or more platters having a diameter that is smaller than approximately 1.8". The media player 500 may be connected to memory 514 such as RAM, ROM, low latency nonvolatile memory such as flash memory and/or other suitable electronic data storage. The media player 500 also may support connections with a WLAN via a WLAN network interface 516. Still other implementations in addition to those described above are contemplated.

Those skilled in the art can now appreciate from the foregoing description that the broad teachings of the present invention can be implemented in a variety of forms. Therefore, while this invention has been described in connection with particular examples thereof, the true scope of the invention should not be so limited since other modifications will become apparent to the skilled practitioner upon a study of the drawings, the specification and the following claims.

What is claimed is:

1. An integrated circuit, comprising:
   a memory module configured to store data in one or more of a plurality of locations in the memory module, wherein each location in the memory module has a corresponding memory address;
   a memory repair database configured to store a memory address of each location in the memory module detected to be defective;
   a memory control module configured to, at each power up of the integrated circuit,
      detect one or more locations in the memory module that are defective, including detecting one or more locations in the memory module previously determined to be defective during a previous power up of the integrated circuit,
      locate one or more redundant memory elements in the memory module, and
      store information in the memory repair database, the information associating the memory address of each location in the memory detected to be defective with a corresponding redundant memory element; and
   a redundant memory decoder module configured to, based on the information, physically remap the memory address of each location detected to be defective to the corresponding redundant memory element.

2. The integrated circuit of claim 1, wherein two or more of the memory module, the memory repair database, the memory control module, and the redundant memory decoder module are integrated on a system on a chip.

3. The integrated circuit of claim 1, wherein the memory module includes at least one of electrical fuses and laser fuses configured to remap the memory addresses.

4. The integrated circuit of claim 1, wherein the redundant memory decoder module is embedded within the memory module.

5. The integrated circuit of claim 1, wherein the redundant memory decoder module includes at least one of row decoders, column decoders, bank decoders, and input/output decoders.

6. The integrated circuit of claim 1, wherein the information stored in the memory repair database is erased when the integrated circuit is powered down.

7. The integrated circuit of claim 1, wherein the memory repair database includes volatile memory configured to store the information.

8. A method for operating an integrated circuit, the method comprising:
   storing data in one or more of a plurality of locations in a memory module, wherein each location in the memory module has a corresponding memory address;
   storing a memory address of each location in the memory module detected to be defective in a memory repair module;
   at each power up of the integrated circuit,
      detecting one or more locations in the memory module that are defective, including detecting one or more locations in the memory module previously determined to be defective during a previous power up of the integrated circuit,
      locating one or more redundant memory elements in the memory module, and
      storing information in the memory repair database, the information associating the memory address of each location in the memory detected to be defective with the redundant memory elements; and
   physically remapping the memory addresses to a corresponding redundant memory element.

9. The method of claim 8, further comprising integrating the memory module and the memory repair module on a system on a chip.

10. The method of claim 8, wherein the memory module includes at least one of electrical fuses and laser fuses configured to remap the memory addresses.

11. The method of claim 8, further comprising physically remapping the memory addresses to the redundant memory elements using a redundant memory decoder module.

12. The method of claim 11, further comprising embedding the redundant memory decoder module within the memory module.

13. The method of claim 11, wherein the redundant memory decoder module includes at least one of row decoders, column decoders, bank decoders, and input/output decoders.

14. The method of claim 8, further comprising erasing the information stored in the memory repair database when the integrated circuit is powered down.

15. The method of claim 8, wherein the memory repair database includes volatile memory configured to store the information.

* * * * *